United States Patent
Chuang et al.

(10) Patent No.: US 11,863,149 B2
(45) Date of Patent: Jan. 2, 2024

(54) SIGNAL TRANSMITTER AND IMPEDANCE ADJUSTMENT METHOD THEREOF

(71) Applicant: Novatek Microelectronics Corp., Hsinchu (TW)

(72) Inventors: Shu-Chin Chuang, Tainan (TW); Shih-Chun Lin, Kaohsiung (TW); Ming-Hung Chien, Taichung (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 17/707,991

(22) Filed: Mar. 30, 2022

(65) Prior Publication Data
US 2023/0318578 A1  Oct. 5, 2023

(51) Int. Cl.
*H03H 11/28* (2006.01)
(52) U.S. Cl.
CPC .................... *H03H 11/28* (2013.01)
(58) Field of Classification Search
CPC .... H03H 11/28; H03K 17/164; H03K 17/668; H03K 19/0013; H03K 19/018521
See application file for complete search history.

(56) References Cited

U.S. PATENT DOCUMENTS

| 10,033,412 | B2 | 7/2018 | Lim et al. | |
| 2021/0175875 | A1* | 6/2021 | Li | H03K 19/018528 |
| 2021/0297065 | A1* | 9/2021 | Watabe | H03K 3/012 |

OTHER PUBLICATIONS

Marcel Kossel et al., "A T-Coil-Enhanced 8.5 GB/s High-Swing SST Transmitter in 65 nm Bulk CMOS With <<−16 dB Return Loss Over 10 GHz Bandwidth," IEEE Journal of Solid-State Circuits, vol. 43, Dec. 2008, pp. 2905-2920. (Year: 2008).*
Marcel Kossel et al., "A T-Coil-Enhanced 8.5 GB/s High-Swing SST Transmitter in 65 nm Bulk CMOS With <<−16 dB Return Loss Over 10 GHz Bandwidth," IEEE Journal of Solid-State Circuits, vol. 43, Dec. 2008, pp. 2905-2920.
Yue Lu et al., "Design and Analysis of Energy-Efficient Reconfigurable Pre-Emphasis Voltage-Mode Transmitters," IEEE Journal of Solid-State Circuits, vol. 48, Aug. 2013, pp. 1898-1909.

* cited by examiner

*Primary Examiner* — Patrick C Chen
(74) *Attorney, Agent, or Firm* — JCIPRNET

(57) ABSTRACT

A signal transmitter includes a plurality of driver slices. Each of the driver slices includes a driving circuit, a plurality of first transistors, and a plurality of second transistors. The driving circuit receives an input signal and outputting an output signal. The first transistors provide a first impedance according to signals on gate terminals of the first transistors. The second transistors provide a second impedance according to signals on gate terminals of the second transistors. Each of the gate terminals of the first transistors and the second transistors is selectively coupled to a bias voltage which controls the corresponding first transistor or second transistor to operate in a triode region, or coupled to a predetermined voltage which controls the corresponding first transistor or second transistor to behave as a switch.

14 Claims, 6 Drawing Sheets

SIGNAL TRANSMITTER AND IMPEDANCE ADJUSTMENT METHOD THEREOF

BACKGROUND

Field of the Invention

The invention relates to a signal transmitter and an impedance adjustment method thereof and more particularly, to a signal transmitter with hybrid impedance control scheme for adjusting impedance thereof.

Description of Related Art

Impedance matching is very important for a signal transmitter for reducing signal reflection phenomenon. Furthermore, a voltage swing of an output signal of the signal transmitter is decided by a voltage diving ratio which is determined by terminal resistances of the signal transmitter and corresponding signal receiver. That is, to control an output impedance of the signal transmitter is an important course for a designer of the signal transmitter.

SUMMARY

The invention provides a signal transmitter and an impedance adjustment method thereof which can enhance a bandwidth for signal transmission.

According to an embodiment of the invention, the signal transmitter includes a plurality of driver slices. Each of the driver slices includes a driving circuit, a plurality of first transistors, and a plurality of second transistors. The driving circuit receives an input signal and outputting an output signal. The first transistors are coupled in parallel between a power terminal of the signal transmitter and the driving circuit, and provide a first impedance according to signals on gate terminals of the first transistors. The second transistors are coupled in parallel between a reference ground terminal of the signal transmitter and the driving circuit, and provide a second impedance according to signals on gate terminals of the second transistors. Each of the gate terminals of the first transistors and the second transistors is selectively coupled to a bias voltage which controls the corresponding first transistor or second transistor to operate in a triode region, or coupled to a predetermined voltage which controls the corresponding first transistor or second transistor to behave as a switch.

According to another embodiment of the invention, the impedance adjustment method is adapted for a signal transmitter where the signal transmitter has a plurality of first transistors, a driving circuit and a plurality of second transistors coupled in series. The impedance adjustment method includes: selectively providing a bias voltage to each of gate terminals of the first transistors and the second transistors to control the corresponding first transistor or second transistor to operate in a triode region; or, selectively providing a predetermined voltage to each of the gate terminals of the first transistors and the second transistors to control the corresponding first transistor or second transistor to behave as a switch.

To sum up, the signal transmitter provides a plurality of first transistors and second transistors for impedance adjusting. A gate terminal of each of the first transistors and the second transistors is selectively coupled to a bias voltage for controlling corresponding first transistor and second transistor to operate in a triode region or behave as a switch. Such as that, the signal transmitter can adjust an impedance by a hybrid impedance control scheme. A bandwidth for signal transmission of the signal transmitter can be enhanced and quality go a transmitted signal can be improved correspondingly.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
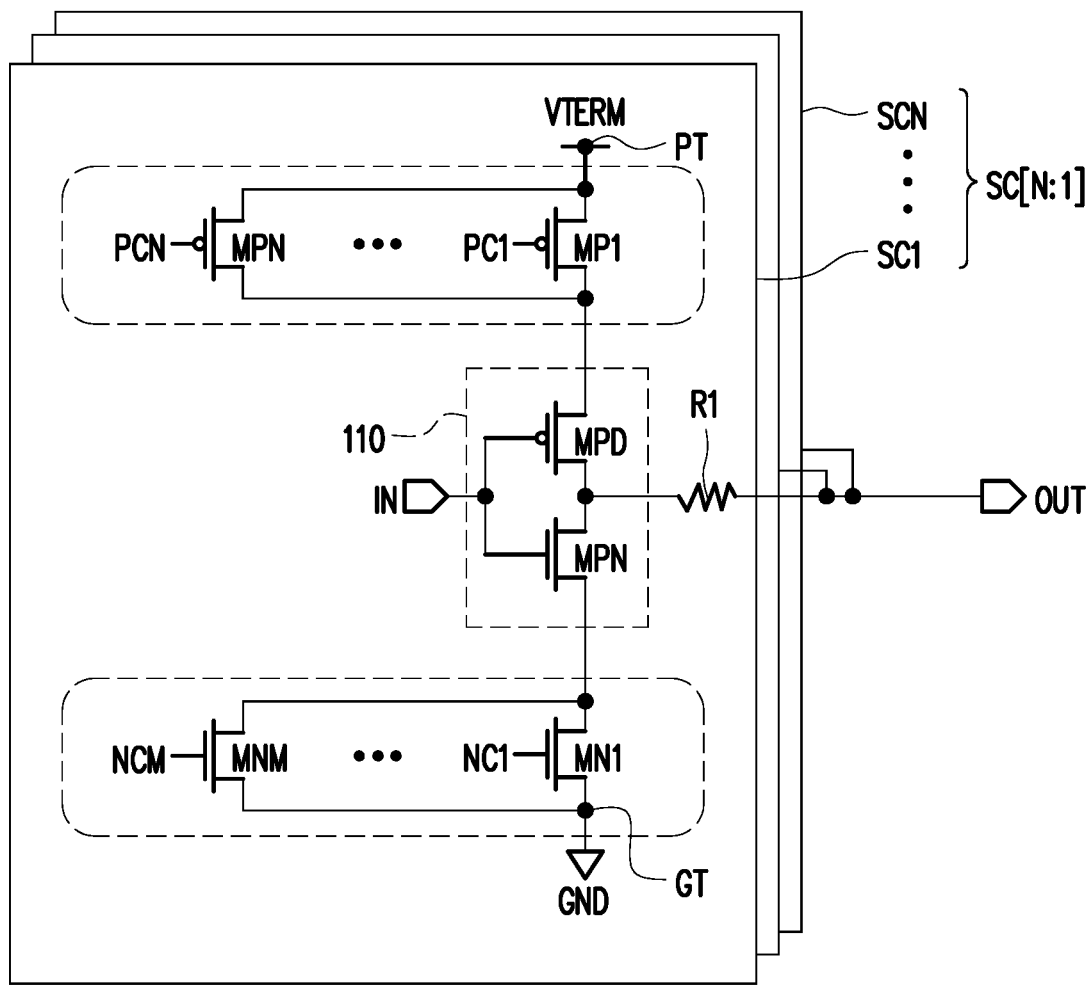
FIG. 1 illustrates a schematic diagram of a signal transmitter according to an embodiment of present disclosure.

The term "couple (or connect)" throughout the specification (including the claims) of this application are used broadly and encompass direct and indirect connection or coupling means. For instance, if the disclosure describes a first apparatus being coupled (or connected) to a second apparatus, then it should be interpreted that the first apparatus can be directly connected to the second apparatus, or the first apparatus can be indirectly connected to the second apparatus through other devices or by a certain coupling means. In addition, terms such as "first" and "second" mentioned throughout the specification (including the claims) of this application are only for naming the names of the elements or distinguishing different embodiments or scopes and are not intended to limit the upper limit or the lower limit of the number of the elements not intended to limit sequences of the elements. Moreover, elements/components/steps with same reference numerals represent same or similar parts in the drawings and embodiments. Elements/components/notations with the same reference numerals in different embodiments may be referenced to the related description.

Please refer to FIG. 1, which illustrates a schematic diagram of a signal transmitter according to an embodiment of present disclosure. The signal transmitter 100 includes a plurality of driver slices SC[N:1], wherein the driver slices SC[N:1] are coupled in parallel and generate an output signal OUT commonly. Each of the driver slices SC[N:1] includes a driving circuit 110, a plurality of transistors MP1~MPN, a plurality of transistor MN1~MNM, and a resistor R1 (termination resistor). The driving circuit 110 includes transistors MPD and MND, and is used to receive an input signal IN and output the output signal OUT. The transistors MPD and MND are coupled in series between the transistors MP1~MPN and the transistors MN1~MNM. Gate terminals of the transistors MPD and MND form an input terminal of the driving circuit 110 for receiving the input signal IN, and a coupling terminal of the transistors MPD and MND forms an output terminal of the driving circuit 110 for generating the output signal OUT. The transistors MP1~MPN are coupled in parallel. Each of the transistors MP1~MPN is coupled between a power terminal PT of the signal transmitter 100 and the driving circuit 110, wherein the power terminal PT of the signal transmitter 100 is used to receive a power voltage VTERM. The driver slices SC[N:1] are used to provide an impedance of a pull-up branch of the driving circuit 110, wherein the impedance of the pull-up branch is adjusted to be close to a first impedance setting value based on adjusting the resistance of each of the parallel-coupled transistors MP1~MPN in each driver slice. For example, when the first impedance setting value (the impedance of the pull-up branch) is 50 Ohm and the quantity of the driver slices SC[N:1] is twenty driver slices, each driver slice has to contribute 1K Ohm such that the twenty driver slices in parallel can make the impedance of the pull-up branch reach 50 Ohm. In such a case, the 1K Ohm is contributed by the parallel-coupled transistors MP1~MPN, the transistor MPD and the termination resistor R1 of each driver slice. Therefore, the first impedance setting value is reached by adjusting the resistance of each of the transistors MP1~MPN to compensate for the process variation of transistors.

The transistors MN1~MNM are coupled in parallel. Each of the transistors MP1~MPN is coupled between a reference ground terminal GT of the signal transmitter 100 and the driving circuit 110, wherein the reference ground terminal GT of the signal transmitter 100 is used to receive a reference ground voltage GND. The driver slices SC[N:1] are also used to provide an impedance of a pull-down branch of the driving circuit 110, wherein the impedance of the pull-down branch is adjusted to be close to a second impedance setting value based on adjusting the resistance of each of the parallel-coupled transistors MN1~MNM in each driver slice. In detail, gate terminals of transistors MP1~MPN respectively receive a plurality of control voltages PC1~PCN. Each of the transistors MP1~MPN is set to operate in a triode region or in a deep triode region according to a corresponding one of control voltages PC1~PCN applied to a gate terminal of each of the transistors MP1~MPN. Anyone of the transistors MP1~MPN which operates in the deep triode region (a voltage drop between drain and source (Vds) thereof is approximate to zero) behaves as a switch. In present embodiment, a part of the transistors MP1~MPN may be selected to behave as the switches and another part of the transistors MP1~MPN may be selected to operate in triode region. Take the transistor MP1 as an example. When the transistor MP1 is selected to behave as the switch according to the control voltage PC1 applied to the gate terminal of the transistor MP1, the transistor MP1 can be turned on or cut off according to the control voltage PC1. If the transistor MP1 is turned on and behave as the switch, the impedance provided by the transistor MP1 is a drain-to-source resistance of the transistor MP1 in the deep triode region. Furthermore, if the transistor MP1 is select to operate in the triode region according to the control voltage PC1, the impedance provided by the transistor MP1 can be adjusted by a voltage level of the control voltage PC1 and in other words, the impedance provided by the transistor MP1 is a drain-to-source resistance of the transistor MP1 in the triode region. The transistor MP1 operating in the triode region likes a voltage-controlled resistor. Therefore, the first impedance setting value is reached by adjusting the resistance of each of the transistors MP1~MPN to compensate for the process variation of transistors.

Please be noted here, the number of the transistors MP1~MPN selected to behave as the switches is not limited. In this embodiment, one to all of the transistors MP1~MPN may be selected to behave as the switches. Also, the number of the transistors MP1~MPN selected to operate in the triode region is also not limited, too. One to all of the transistors MP1~MPN may be selected to operate in the triode region.

On the other hand, gate terminals of transistors MN1~MNM respectively receive a plurality of control voltages NC1~NCM. Each of the transistors MN1~MNM is set to operate in the triode region or in a deep triode region according to a corresponding one of control voltages NC1~NCM applied to a gate terminal of each of the transistors MN1~MNM. Anyone of the transistors MN1~MNM which operates in the deep triode region (Vds is approximate to zero) behaves as a switch. In present embodiment, a part of the transistors MN1~MNM may be selected to behave as the switches and another part of the transistors MN1~MNM may be selected to operate in triode region. Take the transistor MN1 as an example. When the transistor MN1 is selected to behave as the switch according to the control voltage NC1 applied to the gate terminal of the transistor MN1, the transistor MN1 can be turned on or cut off according to the control voltage NC1. If the transistor MN1 is turned on and behave as the switch, the impedance provided by the transistor MN1 is a drain-to-source resistance of the transistor MN1 in the deep triode region. Furthermore, if the transistor MN1 is select to operate in the triode region according to the control voltage NC1, the impedance provided by the transistor MN1 can be adjusted by a voltage level of the control voltage NC1. The transistor MN1 operating in the triode region likes a voltage-controlled resistor. Therefore, the second impedance setting value is reached by adjusting the resistance of each of the transistors MN1~MNM to compensate for the process variation of transistors.

Please be noted here, number of the transistors NP1~NPM selected to behave as the switches is not limited. In this embodiment, one to all of the transistors MN1~MNM may be selected to behave as the switches. Also, the number of the transistors MN1~MNM selected to operate in the triode region is also not limited, too. One to all of the transistors MN1~MNM may be selected to operate in the triode region. Furthermore, in this embodiment, the number of the transistor MP1~MPN and the number of the transistor MP1~MPN may be the same or different. It is noted that the first impedance setting value and the second impedance setting value may be individually predetermined. Since the impedance of the pull-up branch and the impedance of the pull-down branch are individually adjusted, PMOS and NMOS mismatch may be compensated.

Figure 2:
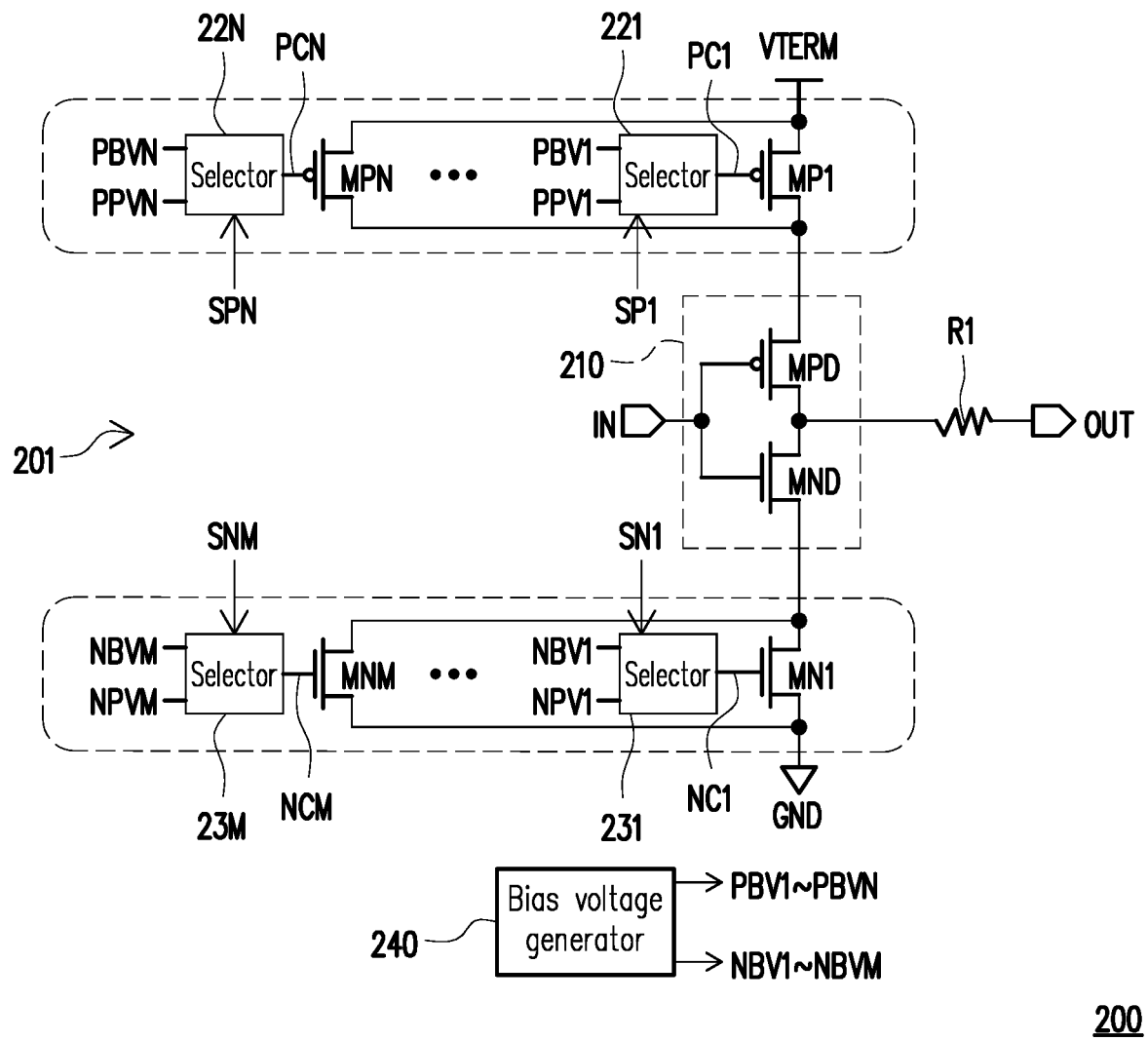
FIG. 2 illustrates a schematic diagram of a signal transmitter according to another embodiment of present disclosure.

Please refer to FIG. 2, which illustrates a schematic diagram of a signal transmitter according to another embodiment of present disclosure. The signal transmitter 200 includes a driver slice 201, and the driver slice 201 includes driving circuit 210, a plurality of transistors MP1~MPN, a plurality of transistors MN1~MNM, a resistor R1, a plurality of selectors 221~22N, a plurality of selectors 231~23M and a bias voltage generator 240. The selectors 221~22N and selectors 231~23M form a control voltage generator. The selectors 221~22N are respectively coupled to gate terminals of the transistors MP1~MPN, and the selectors 231~23M are respectively coupled to gate terminals of the transistors MN1~MNM.

The selectors 221~22N respectively receive a plurality of bias voltages PBV1~PBVN, and also respectively receive a plurality of predetermined voltages PPV1~PPVN. Each of the bias voltages PBV1~PBVN is used for controlling a transistor to operate in the triode region, and ach of the predetermined voltages PPV1~PPVN is used for either cutting off a transistor or turning on a transistor to behave as a switch (i.e., operate in the deep triode region). The selectors 221~22N are controlled by selection signal SP1~SPN. Each of the selectors 221~22N respectively selects the received predetermined voltage or the received bias voltage according to one of the selection signals SP1~SPN and output the selected voltage as a corresponding control voltage of a plurality of control voltages PC1~PCN to the gate terminals of a corresponding transistor of the transistors MP1~MPN. Take the selector 221 as an example, the selectors 221 generates the control voltage PC1 according to either the bias voltage PBV1 or the predetermined voltage PPV1 which control the drain-to-source resistance of the transistor MP1. Such as that, an equivalent resistance of a pull-up branch of the signal transmitter 200 can be adjusted to close to the first impedance setting value by applying the control voltages PC1~PCN to the gate terminals of the transistors MP1~MPN.

On the other hand, the selectors 231~23M respectively receive a plurality of bias voltages NBV1~PBVM and also respectively receive a plurality of predetermined voltages NPV1~NPVM. Each of the bias voltages NBV1~NBVN is used for controlling a transistor to operate in the triode region, and ach of the predetermined voltages NPV1~NPVM is used for either cutting off a transistor or turning on a transistor to behave as a switch (i.e., operate in the deep triode region). The selectors 231~23M are controlled by selection signal SP1~SPN. The selectors 231~23M respectively generate a plurality of control voltages NC1~NCM to the gate terminals of the transistors MN1~MNM. Each of the selectors 231~23M respectively selects the received predetermined voltage or the received bias voltage according to one of the selection signals SN1~SNM and output the selected voltage as a corresponding control voltage of a plurality of control voltages NC1~NCM to the gate terminals of a corresponding transistor of the transistors MN1~MNM. Take the selector 231 as an example, the selectors 231 generates the control voltage NC1 according to the bias voltage NBV1 or the predetermined voltage NPV1 which control the drain-to-source resistance of the transistor MN1. Such as that, an equivalent resistance of a pull-down branch of the signal transmitter 200 can be adjusted to close to the second impedance setting value by applying the control voltages NC1~NCM to the gate terminals of the transistors MN1~MNM.

The driving circuit 210 includes transistors MPD and MND. The transistors MPD and MND are coupled in series between the transistors MP1~MPN and the transistors MN1~MNM. Gate terminals of the transistors MPD and MND form an input terminal of the driving circuit 210 for receiving the input signal IN, and a coupling terminal of the transistors MPD and MND forms an output terminal of the driving circuit 210 for generating the output signal OUT.

The bias voltage generator 240 is coupled to the selectors 221~22N and 231~23M. The bias voltage generator 240 is used to generate the bias voltage PBV1~PBVN and NBV1~NBVM. The bias voltage generator 240 may be implemented by any voltage generator well known by a person skilled in this art, and no special limitation here.

In this embodiment, for setting each of the transistors each of the transistors MP1~MPN to operate in the triode region, each of the bias voltage PBV1~PBVN may be in a range between 0V and a half of the power voltage VTERM of the signal transmitter 200. Also, for setting each of the transistors MN1~MNM to operate in the triode region, each of the bias voltages NBV1~NBVM may be in a range between the power voltage VTERM of the signal transmitter 200 and a reference voltage VDD. The power voltage VTERM and the reference voltage VDD are two supply voltages separately applied to the signal transmitter 200. In some embodiments, the reference voltage VDD may be larger than the power voltage VTERM. For example, the power voltage VTERM=0.8V and the reference voltage VDD=1.5V.

On the other hand, in this embodiment, for setting each of the transistors MP1~MPN to behave as the switch, each of the predetermined voltages PPV1~PPVN may be a first predetermined voltage or a second predetermined voltage, wherein the first predetermined voltage and the second predetermined voltage may be constant voltages and the first predetermined voltage may be larger than the second predetermined voltage. In this embodiment, the first predetermined voltage may be the reference voltage VDD, and the second predetermined voltage may be a ground voltage (=0V). Also, for setting each of the transistors MN1~MNM to behave as the switch, each of the predetermined voltages NPV1~NPVM may be the reference voltage VDD or the ground voltage.

Figure 3:
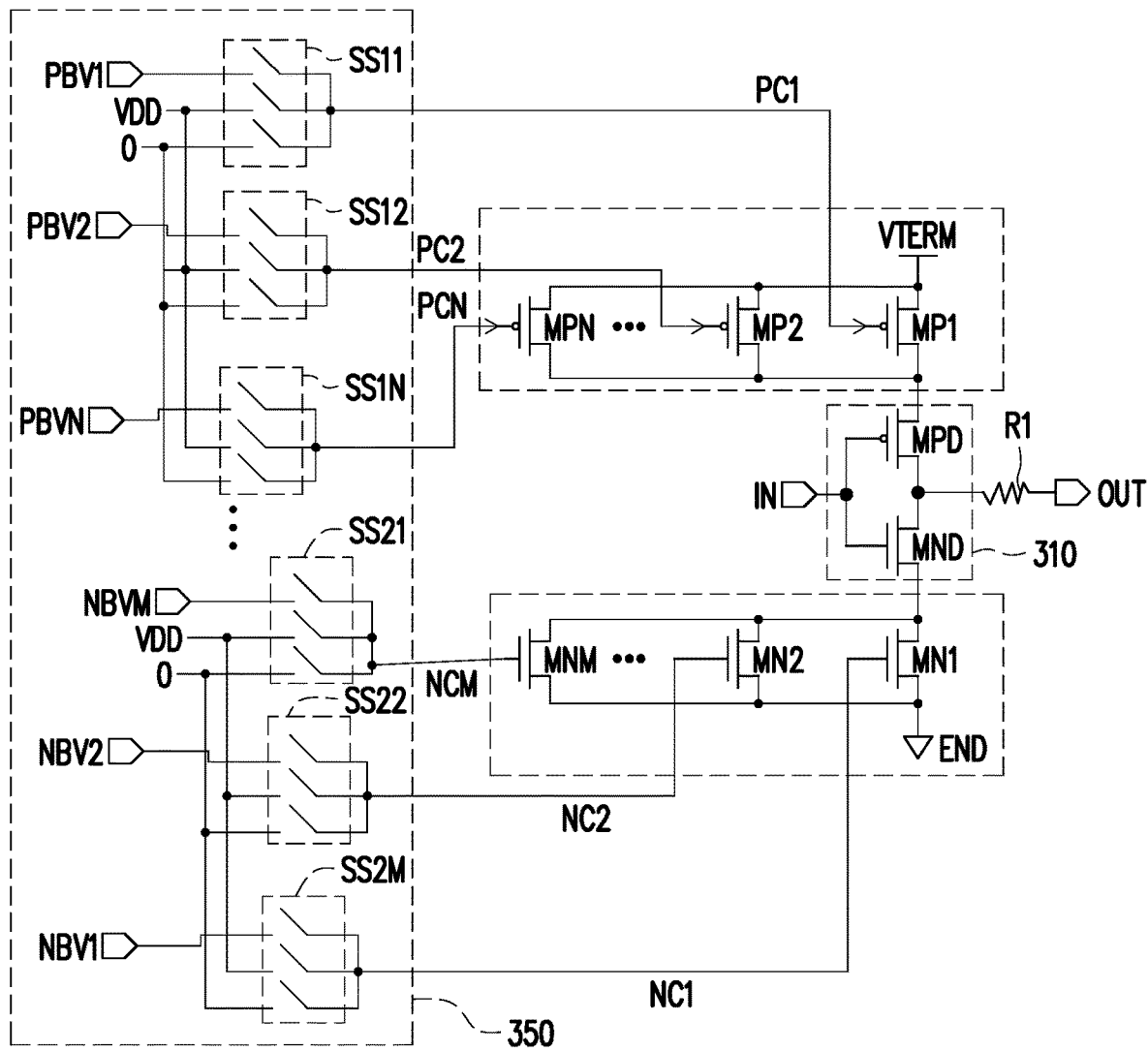
FIG. 3 illustrates a schematic diagram of a signal transmitter according to another embodiment of present disclosure.

Please refer to FIG. 3, which illustrates a schematic diagram of a signal transmitter according to another embodiment of present disclosure. The signal transmitter 300 includes a plurality of driver slices for generating an output signal OUT according to an input signal IN. Each of the driver slices includes a driving circuit 310, a plurality of transistors MP1~MPN, a plurality of transistors MN1~MNM and a control voltage generator 350 and a termination resistor R1. The transistors MP1~MPN are coupled in parallel, and provide an equivalent resistance of a pull-up branch of the signal transmitter 300. The transistors MN1~MNM are coupled in parallel, and provide an equivalent resistance of a pull-down branch of the signal transmitter 300. The transistors MP1~MPN respectively receive a plurality of control voltages PC1~PCN to control the equivalent resistance of the pull-up branch close to a first impedance setting value. The transistors MN1~MNM respectively receive a plurality of control voltages NC1~NCM to control the equivalent resistance of the pull-down branch close to a second impedance setting value.

The control voltage generator 350 is coupled to gate terminals of the transistors MP1~MPN and MN1~MNM. The control voltage generator 350 is configured to provide the control voltages PC1~PCN to the gate terminals of the transistors MP1~MPN, and provide a plurality of control voltages NC1~NCM to the gate terminals of the transistors MN1~MNM. In this embodiment, each of the transistors MP1~MPN may operate in a triode region or behave as a switch according to each of the control voltages PC1~PCN, and each of the transistors MN1~MNM may operate in the triode region or behave as the switch according to each of the control voltages NC1~NCM.

In this embodiment, the control voltage generator 350 includes a plurality of selectors SS11~SS1N and SS21~SS2M. The selectors SS11~SS1N are configured to provide the control voltages PC1~PCN and the selectors SS21~SS2M are configured to provide the control voltages NC1~NCM. Each of the selectors SS11~SS1N may include three switches, and the three switches of each of the selectors SS11~SS1N may respectively receive corresponding bias voltage PBV1~PBVN, a reference voltage VDD and a ground voltage (=0V). Merely one of the three switches of each of the selectors SS11~SS1N can be turned-on to select one of the bias voltages PBV1~PBVN, the reference voltage VDD or the ground voltage to generate each of the control voltages PC1~PCN.

Each of the selectors SS21~SS2M may include three switches, and the three switches of each of the selectors SS21~SS2M may respectively receive corresponding bias voltage NBV1~NBVM, the reference voltage VDD and the ground voltage (=0V). Merely one of the three switches of each of the selectors SS21~SS2N can be turned-on to select one of the bias voltages NBV1~NBVM, the reference voltage VDD or the ground voltage to generate each of the control voltages NC1~NCM.

It should be noted, the transistors MP1~MPN may be P-type transistors, and the transistors MN1~MNM may be N-type transistors.

Figure 4:
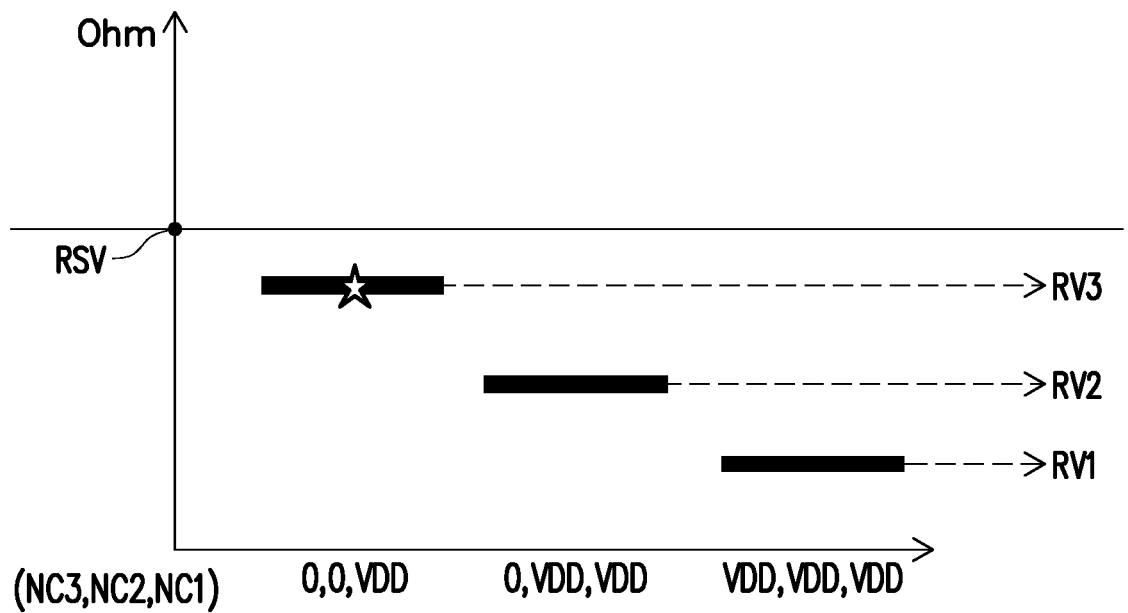
FIG. 4 illustrates schematic diagram for an impedance adjustment scheme of a signal transmitter according to an embodiment of present disclosure.

Please refer to FIG. 3 and FIG. 4 commonly, wherein FIG. 4 illustrates schematic diagram for an impedance adjustment scheme of a signal transmitter according to an embodiment of present disclosure. In FIG. 4, a vertical axis represents the impedance of the pull-down branch of the signal transmitter 300, and a horizontal axis represents voltage states of the control voltages NC1~NC3. In this embodiment, there are three transistors MN1~MN3 in each driver slice are used to form the pull-down branch. For adjusting the resistance of pull-down branch of the signal transmitter 400, in a full digital adjustment manner, each of the control voltages NC1~NC3 may be the reference voltage VDD or the ground voltage (=0V), and in FIG. 4 the control voltages (NC3, NC2, NC1) may respectively equal (0V, 0V, VDD), (0V, VDD, VDD), and (VDD, VDD, VDD) as examples. When the control voltages (NC3, NC2, NC1) respectively equal (0V, 0V, VDD), the resistance of pull-down branch may be a resistance RV3 which is approximate to the termination resistor R1, the drain-to-source resistance of the transistor MND, and the drain-to-source resistance of the transistor MN1 coupled in series; when the control voltages (NC3, NC2, NC1) respectively equal (0V, VDD, VDD), the resistance of pull-down branch may be a resistance RV2 which is approximate to the termination resistor R1, the drain-to-source resistance of the transistor MND, and a parallel-coupled resistance coupled in series, wherein the parallel-coupled resistance is formed by the drain-to-source resistance of the transistor MN1 in parallel with the drain-to-source resistance of the transistor MN2 (in the deep triode region); and when the control voltages (NC3, NC2, NC1) respectively equal (VDD, VDD, VDD), the resistance of pull-down branch may be a resistance RV1 which is approximate to the termination resistor R1, the drain-to-source resistance of the transistor MND, and a parallel-coupled resistance coupled in series, wherein the parallel-coupled resistance is formed by the drain-to-source resistance of the transistor MN1 in parallel with the drain-to-source resistance of the transistor MN2 and in parallel with the drain-to-source resistance of the transistor MN3, wherein the resistance RV3>the resistance RV2>the resistance RV1.

When an impedance setting value RSV with a relative larger value is set, in an adjusting operation, the control voltages (NC3, NC2, NC1) may be respectively set to (0V, 0V, VDD), and the resistance RV3 which closes to the impedance setting value RSV can be obtained.

Figure 5:
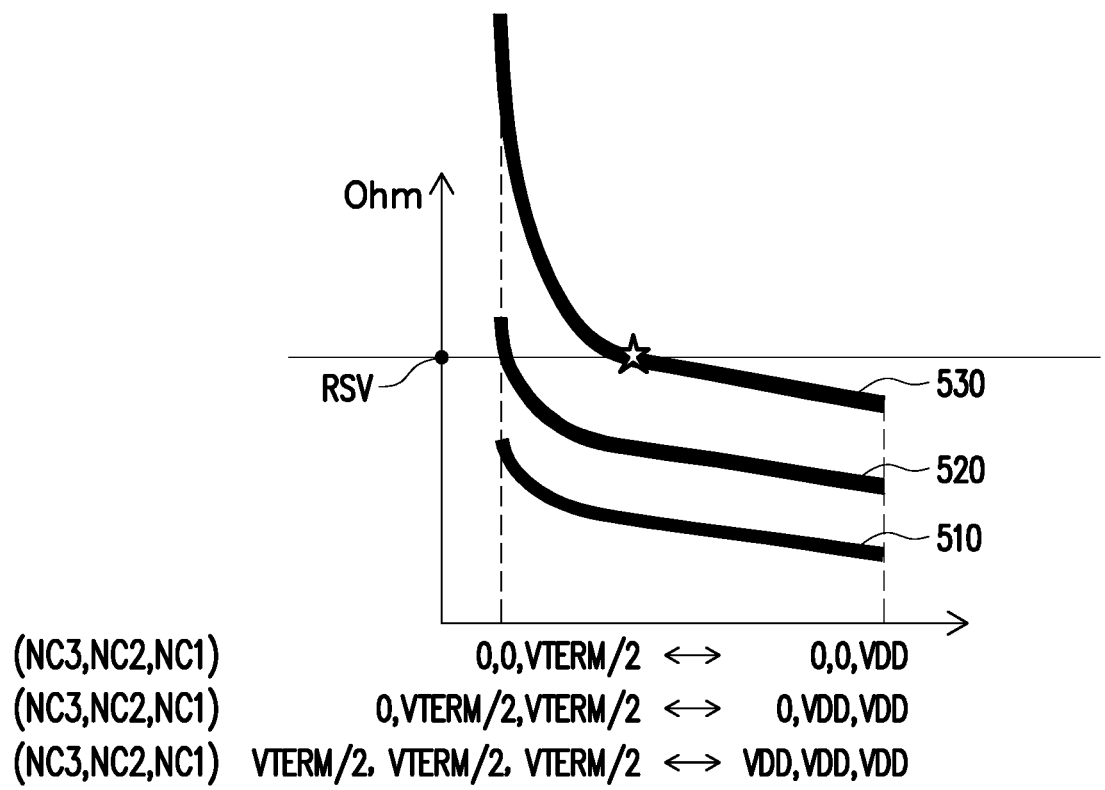
FIG. 5 illustrates schematic diagram for another impedance adjustment scheme of a signal transmitter according to an embodiment of present disclosure.

Please refer to FIG. 3 and FIG. 5 commonly, wherein FIG. 5 illustrates schematic diagram for another impedance adjustment scheme of a signal transmitter according to an embodiment of present disclosure. In FIG. 5, a vertical axis represents the impedance of the pull-down branch of the signal transmitter 300, and a horizontal axis represents voltage states of the control voltages NC1~NC3. In this embodiment, there are three transistors MN1~MN3 are used to form the pull-down branch. A curve 510 represents the all possible impedances of the pull-down branch of the signal transmitter 300, which are obtained by configuring each of the control voltages NC1~NC3 to be in a range from a half of the power voltage VTERM to the reference voltage VDD, do not reach the impedance setting value RSV. A curve 520 represents the all possible impedance of the pull-down branch of the signal transmitter 300, which are obtained by configuring the control voltage NC3 to be 0V and configuring the control voltages NC2 and NC1 to be in a range from the half of the power voltage VTERM to the reference voltage VDD, and in such a condition, a proper setting of the control voltages NC2 and NC1 may help the impedance of the pull-down branch reach the impedance setting value RSV. A curve 530 represents the all possible impedance of the pull-down branch of the signal transmitter 300, which are obtained by configuring the control voltages NC3 and NC2 to be 0V and configuring the control voltage NC1 to be in a range from the half of the power voltage VTERM to the reference voltage VDD, and in such a condition, a proper setting of the control voltage NC1 may help the impedance of the pull-down branch reach the impedance setting value RSV.

For adjusting the resistance of pull-down branch of the signal transmitter 300, each of the control voltages NC1~NC3 may be the reference voltage VDD or the ground voltage (=0V) initially. In an analog adjustment manner, at least one of the control voltages NC1~NC3 which is gradually reduced from the reference voltage VDD to a half of the power voltage VTERM of the signal transmitter 300, and the resistance of the pull-down branch can be increased gradually.

In a curve 510, the control voltages NC1~NC3 are all initially set to the reference voltage VDD. In an adjusting operation (which may be offline or online adjusting operation), all of the control voltages NC1~NC3 may be gradually reduced to half of the power voltage VTERM, and the resistance of the pull-down branch can be increased gradually. In a curve 520, the control voltages (NC3, NC2, NC1) are respectively initially set to (0V, VDD and VDD). In the adjusting operation, the control voltages NC2 and NC1 may be gradually reduced to half of the power voltage VTERM and the control voltage NC3 keeps 0V, and the resistance of the pull-down branch can be increased gradually. In a curve 530, the control voltages (NC3, NC2, NC1) are all initially set to (0V, 0V and VDD). In the adjusting operation, the control voltage NC1 may be gradually reduced to half of the power voltage VTERM and the control voltages NC2 and NC3 keeps 0Vs, and the resistance of the pull-down branch can also be increased gradually.

For adjusting the resistance of the pull-down branch close to the impedance setting value RSV, in this embodiment, the curve 530 can be selected. By setting the control voltages NC2 and NC3 to 0V, and setting the control voltage NC1 in a range between the reference VDD and half of the power voltage VTERM, the resistance of the pull-down branch can be close to (or equal to) the impedance setting value RSV.

Please be noted here, by a person skilled in the art knows, a resistance of the pull-down branch of the signal transmitter 300 can also be adjusted according to the embodiments of FIG. 4 and FIG. 5, and no more repeated description here.

Figure 6:
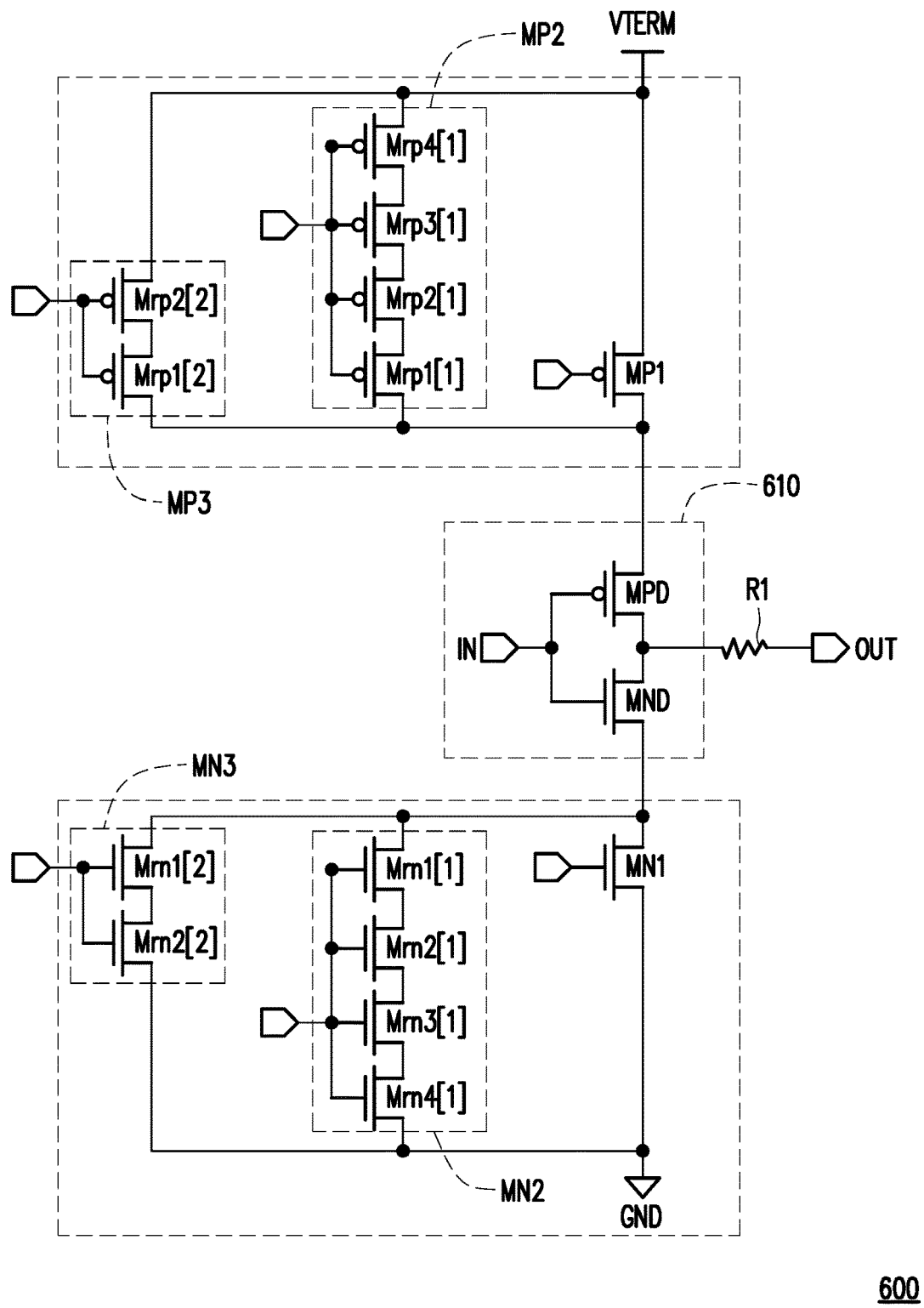
FIG. 6 illustrates a schematic diagram of a signal transmitter according to another embodiment of present disclosure.

Please refer to FIG. 6, which illustrates a schematic diagram of a signal transmitter according to another embodiment of present disclosure. The signal transmitter 600 includes a plurality of driver slices, and each of the driver slices includes a plurality of transistors MP1~MP3, a plurality of transistors MN1~MN3, a driver circuit 610, and a termination resistor R1. In this embodiment, different from the signal transmitter 300, the transistor MP2 is formed by a plurality of sub-transistors Mrp1[1], Mrp2[1], Mrp3[1], Mrp4[1], and the transistor MP3 is formed by two sub-transistors Mrp1[2], Mrp2[2]. The sub-transistors Mrp1[1], Mrp2[1], Mrp3[1], Mrp4[1] are coupled in series between the power voltage VTERM and the driver circuit 610 to form the transistor MP2. The sub-transistors Mrp1[2], Mrp2[2] are coupled in series between the power voltage VTERM and the driver circuit 610 to form the transistor MP3. Gate terminals of the sub-transistors Mrp1[1], Mrp2[1], Mrp3[1], Mrp4[1] can be tied together to receive same control voltage. Gate terminals of the sub-transistors Mrp1[2], Mrp2[2] can be tied together to receive same control voltage, too.

The transistor MN2 is formed by a plurality of sub-transistors Mrn1[1], Mrn2[1], Mrn3[1], Mrn4[1], and the transistor MN3 is formed by two sub-transistors Mrn1 [2], Mrn2[2]. The sub-transistors Mrn1[1], Mrn2[1], Mrn3[1], Mrn4[1] are coupled in series between the reference ground voltage GND and the driver circuit 610 to form the transistor MN2. The sub-transistors Mrn1[2], Mrn2[2] are coupled in series between the reference ground voltage GND and the driver circuit 610 to form the transistor MN3. Gate terminals of the sub-transistors Mrn1 [1], Mrn2[1], Mrn3[1], Mrn4[1] can be tied together to receive same control voltage. Gate terminals of the sub-transistors Mrn1 [2], Mrn2[2] can be tied together to receive same control voltage, too.

In this embodiment, number of sub-transistors of each of the transistors MP1~MP3 and MN1~MN3 has no special limitation. A designer can decide to implement each of the transistors MP1~MP3 and MN1~MN3 by one any number of sub-transistors.

The driver circuit 610 includes transistors MPD and MND coupled in series. The driver circuit 610 receives an input signal IN and generates an output signal OUT.

Figure 7:
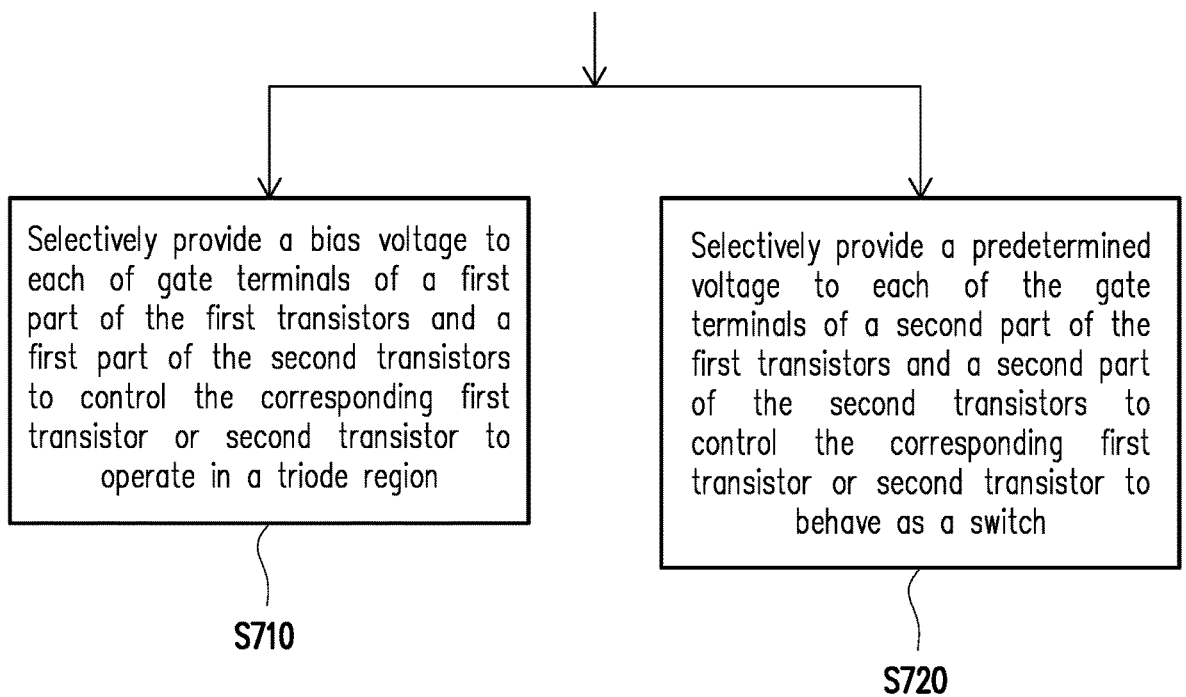
FIG. 7 illustrates a flow chart of an impedance adjustment method according to an embodiment of present disclosure.

Please refer to FIG. 7, which illustrates a flow chart of an impedance adjustment method according to an embodiment of present disclosure. The impedance adjustment method is adapted for a signal transmitter where the signal transmitter has a plurality of first transistors, a driving circuit and a plurality of second transistors coupled in series. In a step S710, the impedance adjustment method can be executed by selectively providing a bias voltage to each of gate terminals of a first part of the first transistors and a first part of the second transistors to control the corresponding first transistor or second transistor to operate in a triode region. In a step S720, the impedance adjustment method can be also executed by selectively providing a predetermined voltage to each of the gate terminals of a second part of the first transistors and a second part of the second transistors to control the corresponding first transistor or second transistor to behave as a switch.

Detail operations about the steps S710 and S720 have been detail described in the embodiments mentioned before, and no more description here.

In summary, present disclosure provides the signal transmitter having constant number of driver slices and can accuracy control a de-emphasis level thereof. In present disclosure, the resistances of the pull-up branch and the pull-down branch can be adjusted individually, and the resistances of the pull-up branch and the pull-down branch can be adjusted by both of the digital manner and the analog manner. Such as that, a resolution of the impedance adjustment can be increased without increasing number of driver circuit, and a circuit size of the signal transmitter can be reduced. Also, the resistances of the pull-up branch and the pull-down branch can be adjusted precisely to effectively improve a bandwidth for signal transmission.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A signal transmitter, comprising:
a plurality of driver slices, wherein each of the driver slices comprises:
a driving circuit, receiving an input signal and outputting an output signal;
a plurality of first transistors, wherein the first transistors are coupled in parallel between a power terminal of the signal transmitter and the driving circuit, and providing a first impedance according to signals on gate terminals of the first transistors; and
a plurality of second transistors, wherein the second transistors are coupled in parallel between a reference ground terminal of the signal transmitter and the driving circuit, and providing a second impedance according to signals on gate terminals of the second transistors,
a plurality of first selectors, respectively coupled to the gate terminals of the first transistors, wherein each of the first selectors selects one of the corresponding bias voltage and a first predetermined voltage to transmit to the gate terminal of each of the first transistors according to a first selection signal; and
a plurality of second selectors, respectively coupled to the gate terminals of the second transistors, wherein each of the second selectors selects one of the corresponding bias voltage and a second predetermined voltage to transmit to the gate terminal of each of the second transistors according to a second selection signal,
wherein each of the first transistors operates in a triode region when receives the corresponding bias voltage, and behaves as a first switch when receives the first predetermined voltage; and each of the second transistors operates in the triode region when receives the corresponding bias voltage, and behaves as a second switch when receives the second predetermined voltage.

2. The signal transmitter as claimed in claim 1, further comprising:
a control voltage generator, coupled to the gate terminals of the first transistors and the second transistors, generating a plurality of first control voltages according to the bias voltage and/or the predetermined voltage which control an equivalent resistance of a pull-up branch formed by the plurality of driver slices close to a first impedance setting value, and generating a plurality of second control voltages according to the bias voltage and/or the predetermined voltage which control an equivalent resistance of a pull-down branch formed by the plurality of driver slices close to a second impedance setting value.

3. The signal transmitter as claimed in claim 1, further comprising:
a control voltage generator, coupled to the first transistors and the second transistors, generating the first control voltages according to a first impedance setting value, and generating the second control voltages according to a second impedance setting value.

4. The signal transmitter as claimed in claim 1, wherein a first bias voltage which controls the first transistor to operate in the triode region is in a range between 0V and a half of a power voltage of the signal transmitter, and a second bias voltage which controls the second transistor to operate in the triode region is in a range between a half of the power voltage of the signal transmitter and the predetermined voltage.

5. The signal transmitter as claimed in claim 1, wherein the control voltage generator comprises:
wherein each of the first selectors selects the corresponding bias voltage, a first predetermined voltage or a second predetermined voltage to transmit to the gate terminal of each of the first transistors according to a first selection signal; and
wherein each of the second selectors selects the corresponding bias voltage, the first predetermined voltage or the second predetermined voltage to transmit to the gate terminal of each of the second transistors according to a second selection signal,
wherein the first predetermined voltage and the second predetermined voltage are constant voltages and the first predetermined voltage is higher than the second predetermined voltage.

6. The signal transmitter as claimed in claim 1, wherein each of the first transistor comprises at least one first sub-transistors coupled in series, each of the second transistor comprises at least one second sub-transistors coupled in series.

7. The signal transmitter as claimed in claim 1, wherein the first transistors are P-type transistors and the second transistors are N-type transistors.

8. The signal transmitter as claimed in claim 1, wherein the driving circuit comprises:
a third transistor, having a first terminal coupled to the first transistors, a gate terminal of the third transistor receiving the input signal, and a second terminal of the third transistor generating the output signal; and
a fourth transistor, having a first terminal coupled to the second terminal of the third transistor, a gate terminal of the fourth transistor receiving the input signal, and a second end of the fourth transistor being coupled to the second transistors.

9. The signal transmitter as claimed in claim 1, wherein the driving circuit further comprises:
a resistor, having a first terminal coupled to the second terminal of the third transistor, and a second terminal of the resistor providing the output signal.

10. An impedance adjustment method, adapted for a signal transmitter where the signal transmitter has a plurality of first transistors, a driving circuit and a plurality of second transistors, the impedance adjustment method comprising:
disposing the plurality of first transistors on a path for receiving a power voltage by the driving circuit;
disposing the plurality of second transistors on a path for receiving a reference ground voltage by the driving circuit;
selectively providing a bias voltage to each of gate terminals of the first transistors and the second transistors to control the corresponding first transistor and second transistor to operate in a triode region; and
selectively providing a predetermined voltage to each of the gate terminals of the first transistors and the second transistors to control the corresponding first transistor and second transistor to behave as a switch.

11. The impedance adjustment method as claimed in claim 10, further comprising:
generating a plurality of first control voltages according to the bias voltage and/or the predetermined voltage which control an equivalent resistance of a pull-up branch formed by the plurality of driver slices close to a first impedance setting value; and
generating a plurality of second control voltages according to the bias voltage and/or the predetermined voltage which control an equivalent resistance of a pull-down branch formed by the plurality of driver slices close to a second impedance setting value.

12. The impedance adjustment method as claimed in claim 11, further comprising:
determining, in a first adjusting operation, a cut-off number of the first transistors which are cut-off by the first control voltages; and
determining, in the first adjusting operation, a cut-off number of the second transistors which are cut-off by the second control voltages.

13. The impedance adjustment method as claimed in claim 11, further comprising:
adjusting, in a second adjusting operation, an impedance of each of the first transistor which is not cut-off by adjusting a first bias voltage; and
adjusting, in the second adjusting operation, an impedance of each of the second transistor which is not cut-off by adjusting a second bias voltage.

14. The impedance adjustment method as claimed in claim 10, further comprising:
selecting, by each of a plurality of first selectors, the corresponding bias voltage, a first predetermined voltage or a second predetermined voltage to transmit to the gate terminal of each of the first transistors according to a first selection signal; and
selecting, by each of a plurality of second selectors, the corresponding bias voltage, the first predetermined voltage or the second predetermined voltage to transmit to the gate terminal of each of the second transistors according to a second selection signal,
wherein the first predetermined voltage and the second predetermined voltage are constant voltages and the first predetermined voltage is higher than the second predetermined voltage.

* * * * *